United States Patent [19]

Agrawal et al.

[11] Patent Number: 4,979,234
[45] Date of Patent: Dec. 18, 1990

[54] SATURATED SEMICONDUCTOR LASER AMPLIFIER FOR COMPENSATION OF OPTICAL FIBRE DISPERSION

[75] Inventors: Govind P. Agrawal; Nils A. Olsson, both of New Providence, N.J.

[73] Assignee: AT&T Bell Laboratories, Murray Hill, N.J.

[21] Appl. No.: 288,340

[22] Filed: Dec. 20, 1988

[51] Int. Cl.$^5$ ............................................. G02F 1/00
[52] U.S. Cl. ..................................... 455/608; 330/4.3
[58] Field of Search ................... 455/608, 613; 370/3; 330/4.3

[56] References Cited

U.S. PATENT DOCUMENTS 4,588,957 5/1986 Balant et al. ........................ 455/610
4,612,645 9/1986 Corum ................................. 372/76

OTHER PUBLICATIONS

*Electronics and Communications in Japan*, vol. 59-C, No. 3, 1976, "Use of Chirp Pulses to Improve the Pulse Transmission Characteristics in a Dielectric Optical Waveguide" by T. Suzuki, pp. 117-125.

Optical Communications, "1000 Times Expansion/-Compression of Optical Poises for Chirped Pulse Amplification", Pessot et al; pp. 1-9.

J. Opt. Soc. Am. B; vol. 1, No. 2, "Compression of Optical Pulses Chirped by Self Phase Modulation in Fibers"; Tomlinson et al; pp. 139-149.

LLE Review, vol. 25; "Short-Pulse Amplification Using Pulse Compression Techniques"; Oct./Dec. 1985; pp. 41-46.

*Primary Examiner*—Joseph A. Orsino
*Assistant Examiner*—Geoff Sutcliffe
*Attorney, Agent, or Firm*—David I. Caplan

[57] ABSTRACT

The span of an optical dispersion-limited fiber for propagating optical pulses is improved by simultaneously chirping and amplifying the stream by means of a saturated semiconductor laser amplifier. The chirp causes a compression of the pulses as they propagate through an initial portion of the fiber, whereby the span of the fiber is increased.

12 Claims, 1 Drawing Sheet

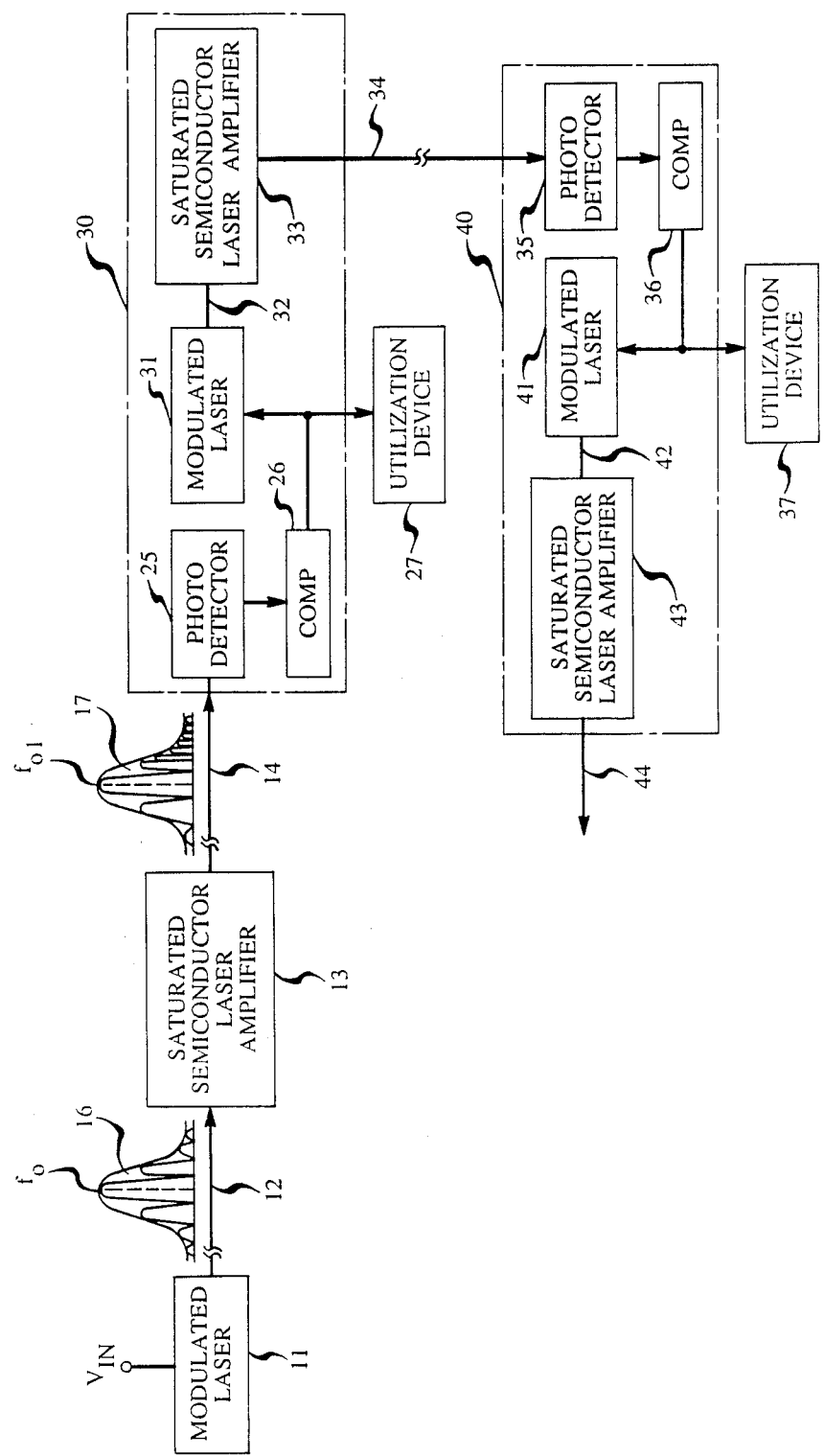

SATURATED SEMICONDUCTOR LASER AMPLIFIER FOR COMPENSATION OF OPTICAL FIBRE DISPERSION

TECHNICAL FIELD

This invention relates to fiber-optic communication systems for digital transmission of information and to methods of operating such systems.

BACKGROUND OF THE INVENTION

In fiber-optic communication systems, digital data are transmitted from sending stations to receiving stations by means of optical pulses propagating in optical fibers. Each of the fibers thus carries (propagates) a digital data stream (sequence) of optical pulses typically formed by pulse code modulation, or other kind of pulse modulation, of a continuous optical wave called the "carrier". This carrier typically is a monochromatic continuous-wave optical beam of radiation, as supplied by a laser oscillator source of light having a wavelength in the near infra-red, for example, a wavelength of about 1.5 $\mu$m (1.5 micrometers). During each predetermined time interval ("slot") the amplitude of the carrier wave is modulated in accordance with one bit of digital information, so that during each such time slot the carrier wave contains a pulse of standard height or no pulse at all, in order to represent a binary digital "1" or "0", respectively, for example. The thus pulse-modulated optical beam propagates through fiber segments (fiber transmission lines), and each of such fiber segments extends from a sending station to a receiving station. At the receiving station, typically the fiber segment terminates in a signal regenerator device to restore the signal—i.e., to reduce noise and to restore the amplitude of the pulses—to a standard level for further propagation in fiber or for other uses.

As the technology progresses, the desired data rates and hence pulse repetition rates increase in order to increase the data handling capacity of the system without concomitantly increasing the required number of relatively costly fiber transmission lines. As these pulse repetition rates are increased to values of 8 GHz (8 gigahertz), corresponding to data rates of 8 Gb/s (8 gigabits/second), or more, a major problem arises because of the phenomenon of optical dispersion by the transmission medium, to wit, the fiber material, particularly in case of a carrier wavelength of about 1.5 $\mu$m. Dispersion is the inherent property of any transmission medium that different optical frequencies (different wavelengths) propagate through the medium at different velocities. Thus, since even a purely monochromatic (single optical frequency) beam of continuous-wave optical radiation is not purely monochromatic after it is modulated, e.g. pulsed, the phenomenon of dispersion of any pulsed optical beam occurs during propagation through fiber. As a result of this dispersion in fiber material, when a stream of digital optical pulses is introduced into one end (input end) of an optical fiber segment, it emerges from the other end (output end) as a stream of optical output pulses that are degraded, i.e., are spread out ("smeared") in time and space. As the length of the fiber segment is increased, the effects of dispersion accumulate, whereby the smearing of the pulses becomes more severe. Thus, as the length of a fiber segment is increased beyond a threshold, the output pulses become unrecognizable (unrestorable) as such. That is, it becomes impossible to determine the transmitted information—i.e., to decide at the output end of the fiber which of the time slots had been designated for carrying a pulse and hence are supposedly representing binary digital "1" or which of the time slots are not carrying a pulse and hence are supposedly representing binary digital "0".

As is known from Fourier transform theory, the product of the half-width of the optical Fourier spectrum of an optical pulse and the width of the pulse (measured in units of time) is equal to unity or more, depending upon the pulse shape (profile). Thus for a given pulse shape, as the pulse repetition rate and hence the data rate increases, the width of each pulse must decrease, and hence the half-width of optical Fourier spectrum must increase. Consequently, the spread of optical frequency Fourier components increases as the data rate increases, whereby the spread of optical propagation velocities due to the fiber material dispersion property increases, and hence for a given fiber span (length) the degradation of signal becomes more severe. Even if the pulse shape is such that its optical spectrum is Fourier transform limited, and thus minimizes the effects of dispersion and hence maximizes the fiber span, the degradation of signal by dispersion in fiber can still be a major problem.

At the same time the fiber disperses a propagating signal it also absorbs light by scattering or other phenomena whereby signal level is undesirably reduced. Thus, although the dispersion problem could be alleviated by using a carrier having a wavelength that undergoes less dispersion, such as a carrier having a wavelength of about 1.3 $\mu$m, the absorption phenomena would then impose an even more serious limitation on fiber span.

In a paper "Use of Chirp Pulses to Improve the Pulse Transmission Characteristics in a Dielectric Optical Waveguide" by T. Suzuki, published in *Electronics and Communications in Japan*, Vol. 59-C, No. 3, pp. 117–125 (1976), it was proposed that a chirped pulse technique be used to modulate the optical frequency of the pulse stream by passing it through a lithium niobate crystal whose refractive index was being frequency-modulated (equivalent to time-dependent phase-modulation) by means of an applied external a.c. electric field of frequency in sychronism with the pulse repetition rate, whereby the optical frequency of the carrier wave varied monotonically across the pulse from its leading (front) edge to it trailing (rear) edge; thus the pulse was chirped. Consequently, the pulse was compressed by dispersion during its transmission through an initial portion of optical fiber: the fiber dispersion slows the propagation of the front portion of the chirped pulse and speeds the propagation of the rear portion thereof. In this way, the chirping of the pulses served to compensate the effects of dispersion, and the total length of fiber segment that was capable of propagating the pulse in a recognizable shape (form) was increased; that is, chirping the pulses increased the span. However, this technique has several shortcomings including a significant lowering of signal level (modulation loss) while propagating through the electro-optic crystal, such as lithium niobate, as well as the requirement of relatively large applied electric fields in the crystal and hence the undesirable consumption of unduly large amounts of energy required to produce a significant chirp and hence a significant increase in the fiber span—i.e., an increase of at least about 50% (a factor of at least about 1.5). As pulse repetition rates increase, and hence as the frequency of electric fields applied to the electro-optic crystal increase, these shortcoming become increasingly severe, so that this technique is impractical for pulse repetition rates equal to or greater than about 1 GHz. Another technique for chirping and hence compressing optical pulses involves the chirping, by self-phase modulation in fiber itself, of intense optical pulses while propagating through the fiber, as described in U.S. Pat. No. 4,588,957, issued on May 13, 1986 to Balant et al. entitled "Optical Pulse Compression Apparatus and Method". However, for pulse repetition rates of 10 GHz and higher, that requires an energy per pulse of more than 10 picojoule per pulse, which is undesirably high.

Therefore it would be desirable to have a technique for increasing the span of fiber capable of propagating optical pulses having a carrier wavelength in the near infra-red and a pulse repetition rate of about 8 GHz or more that avoids the shortcomings of prior art.

SUMMARY OF THE INVENTION

This invention is based upon our discovery that a saturated semiconductor laser amplifier—i.e., a semiconductor laser amplifier operated in a condition of gain saturation—not only can increase the amplitude of an optical beam propagating through the amplifier but also can significantly phase-modulate, and hence frequency-modulate, the optical beam. In particular, we have discovered that a saturated semiconductor laser amplifier can impose a significant chirp upon optical pulses having a pulse repetition rate in the range of 8 to 16 GHz, and having an optical carrier wave of wavelength in the near infra-red, whereby the chirped pulses are significantly compressed after introduction into and propagating through an initial portion of an optical fiber segment, so that degradation of the pulses because of dispersion does not commence until after such initial portion of the fiber segment has been traversed by the propagating pulses. Thus, the chirp in the pulse compensates the dispersion in the fiber so as to compress the pulse as it propagates through the initial portion of the fiber and thereby enhances the span. Obviously, if the length of this initial portion is a significant fraction of the (entire) length of the segment, then and only then will the span be significantly increased.

In a specific embodiment, nearly Fourier-transform-limited optical pulses that have monochromatic carrier wavelengths of about 1.5 μm are chirped by passage through a saturated semiconductor laser amplifier advantageously having the configuration of a channeled substrate buried heterostructure. In this way, for pulses having a repetition rate of about 16 GHz, the chirping of the pulses by the laser amplifier serves to increase the fiber span from about 15 km (15 kilometers) to about 70 km, i.e., by a factor of more than 4. At the same time, the laser amplifier produces an increase in pulse height (amplitude) and hence also in signal level, which thereby compensates any optical scattering and absorption or other signal loss during propagation through the fiber.

The use of a saturated semiconductor laser amplifier to chirp the pulses can thus increase the fiber span to a value which is significantly greater than it would have been in the absence of the chirping. Accordingly, in a fiber optic communication system for digital data transmission, a saturated semiconductor laser amplifier can also advantageously be used in a regenerator for the two-fold purpose of increasing the amplitude of optical pulses (modulation gain) and of compensating for fiber material dispersion.

In another aspect, the invention involves a method of operating a fiber-optic communication system including the step of operating a semiconductor laser amplifier in a condition of gain saturation while an optical pulse stream having a pulse repetition rate of about 8 GHz or more passes through and is amplified by the laser amplifier, emerges from the laser amplifier, and enters into and propagates through an optical fiber segment which exhibits significant optical dispersion. Advantageously, the laser amplifier has a structure such that during its operation the amplifier imposes a phase modulation on the pulses passing therethrough whereby the phase modulation results in a significant chirp of the pulses such that a pulse compression occurs after propagation of the pulses through an initial portion of the fiber segment, the initial portion having a length which is a significant fraction of the fiber span, whereby a significant increase of the fiber span is enabled, even for pulses having energies as small as 0.1 pJ (picojoule) per pulse.

BRIEF DESCRIPTION OF THE DRAWING

This invention, together with its features, characteristics, and advantages may be better understood from the following detailed description when read in conjunction with the drawings in which:

the FIGURE is a block diagram of a fiber optical digital transmission system
in accordance with a specific embodiment of the invention.

DETAILED DESCRIPTION

As shown in the FIGURE, a modulated laser device 11 is optically coupled to a saturated semiconductor laser amplifier 13. The modulated laser device 11 generates and delivers an output stream of optical pulses through a fiber segment 12 (or other optical coupler) to the saturated semiconductor laser amplifier 13. The laser device 11 is modulated by an input voltage $V_{in}$ whereby the output stream is a sequence of optical pulses on an optical carrier wave. The output stream as delivered to the fiber segment 12, has a symmetric Fourier spectrum 16 centered at a frequency $f_o$, the carrier frequency.

The semiconductor laser amplifier 13 is coupled to and receives the output stream of optical pulses from the fiber segment 12 and simultaneously amplifies and chirps the stream of optical pulses. The laser amplifier 13 is coupled to an optical fiber segment 14 and thus generates and delivers a resulting stream of chirped optical pulses to the optical fiber segment 14 in response to the stream from the fiber segment 12. The fiber segment 14, but not the segment 12, has such a long length that it exhibits significant optical dispersion. Emerging from the laser amplifier 13, owing to the chirping the stream has a Fourier spectrum 17 which is not symmetric and is centered at a frequency $f_{01}$ which is ordinarily lower than $f_0$. As this stream propagates through an initial (left-hand) portion of the fiber segment 14 the pulses are compressed; as the stream propagates through an intermediate portion of the fiber segment 14 the pulses expand to their original width; and as the stream propagates through a final (right-hand) portion of the fiber segment 14 the pulses expand further but not above the limit of recognizability, the fiber segment 14 having a suitable length which is no greater than the threshold length of unrecognizability, as discussed.

The output end (right-hand end) of the fiber 14 is coupled to a photodetector 25, such as a standard avalanche photo-diode or a standard PIN photo-diode. The resulting electrical output signal produced by the photodetector 25 is electrically coupled to a comparator 26 which is arranged to produce a binary digital electrical output signal, e.g., a "high" level to represent the presence of a pulse during a given time slot and a "low" level to represent the absence of such pulse. The output end of the comparator 26 is electrically coupled either to another modulated laser device 31 or to a utilization device 27, or to both. Thus the modulated laser 31 or the utilization device 27, or both, receives the binary digital electrical output from the comparator 26. The modulated laser 31 has its output end optically coupled to an input end of a fiber segment 32, or of any standard optical coupler, for optically coupling the modulated laser 31 to another saturated semiconductor laser amplifier 33. When the modulated laser 31 receives the output signal from the comparator 26, this laser 31 produces an output stream of pulses which is received by the fiber segment 32 and delivered by it without significant modification to the saturated semiconductor laser amplifier 33.

The output end of the saturated laser amplifier 33 is optically coupled to an input end of yet another fiber segment 34. Thus, the stream received by the segment 32 is amplified and chirped by the saturated semiconductor laser amplifier 33, in much the same way as the laser amplifier 13, to produce a stream of chirped pulses that enter into and propagate through the fiber segment 34 in much the same way as described above for the stream of pulses propagating through the fiber segment 14.

The photodetector 25, comparator 20, modulated laser 31, segment 32, and saturated semiconductor laser amplifier 33 together thus form a regenerator 30 which restores the pulses to their original amplitude and shape, i.e., to the same Fourier spectrum as that which they had when they emerged from the laser amplifier 13.

Similarly, another photodector 35, comparator 36, modulate laser 41, segment 42, and saturated laser 43 together form another regenerator whose output is delivered to yet another fiber segment 44 or to another utilization device 37, or to both. The semiconductor laser amplifiers 13, 33, and 43 advantageously have substantially identical structures, typically channeled substrate buried heterostructures.

The chirp thus imposed by these laser amplifiers is nearly linear over a central part of each pulse and downshifts the frequency by shifting the phase by a significant fraction of $2\pi$, typically a phase shift of about $\pi$. The net gain produced by each of these saturated laser amplifiers can be in the range of about 10 to 15 dB (decibels) or more, taking into account insertion losses.

Typically the modulated lasers 11, 31, and 41 are substantially identical mode locked semiconductor lasers that are internally or externally modulated by electrical signals ($V_{in}$, for example), each having a structure suitable for supplying at least nearly Fourier transform limited pulses of an optical carrier having a wavelength of about 1.5 $\mu$m.

The fiber segments 12, 14, 32, 34, 42, and 44 are typically standard commercial grade silica fibers. The lengths of fiber segments 12, 32, and 42 are advantageously all equal to less than about 10 km, whereas the lengths of fiber segments 14, 34, and 44 are all equal to about 70 km, for the case where the optical carrier wavelength ($=c/f_o$) is about 1.5 $\mu$m and the pulse repetition rate is about 16 GHz, according to actual successful tests. For the case where the pulse repetition rate is about 8 GHz, the lengths of the fiber segments 14, 34, and 44 can be as much as about 220 km, according to extrapolation (fixed product of bit rate and fiber length) from the tests at 16 GHz. The chirping of the pulses by the laser amplifier downshifts the central frequency $f_o$ to a slightly lower frequency $f_{01}$, typically a shift of about 40 GHz, equivalent to a wavelength increase of about 0.0003 $\mu$m.

Although the invention has been described in detail in terms of a specific embodiment, various modifications can be made without departing from the scope of the invention.

We claim:

1. A fiber-optic communication system for digital transmission of information comprising:
    a first saturated semiconductor laser amplifier, for receiving and amplifying a first input stream of optical pulses to produce a first laser amplifier output stream of chirped optical pulses; and
    a first optical fiber segment having an input end positioned to receive the first laser amplifier output stream of chirped optical pulses from the first laser amplifier, whereby the chirped pulses of the first laser amplifier output stream are compressed during propagation through an initial portion of the first fiber segment and whereby a first fiber output stream of recognizable optical pulses emanates from an output end of the first fiber segment, the initial portion having a length which is a significant fraction of the length of the fiber segment.

2. The system of claim 1 in which the stream has a pulse repetition rate of at least about 8 GHz.

3. The system of claim 1 further comprising
    a second saturated semiconductor laser amplifier arranged for receiving and amplifying a second input stream of optical pulses derived from the first fiber output stream of optical pulses to produce a second laser amplifier output stream of chirped optical pulses; and
    a second optical fiber segment having an input end positioned to receive the second laser amplifier output stream of chirped optical pulses from the second laser amplifier, whereby the chirped pulses of the second laser amplifier output stream are compressed during propagation through an initial portion of the second fiber segment, and whereby a second fiber output stream of recognizable pulses emanates from an output end of the second fiber, the initial portion of the second fiber segment having a length which is a significant fraction of the length of the second segment, so that the span of the second fiber segment is significantly enhanced.

4. The system of claim 3 in which the first stream comprises an optical carrier having a wavelength of about 1.5 $\mu$m, in which the pulse repetition rate is at least 8 GHz, and in which the optical fiber segment is essentially silica.

5. The system of claim 3 in which the optical fiber segment is essentially silica and the pulse repetition rate is at least 8 GHz.

6. A method of operating a fiber-optic communication system for digital data transmission comprising the step of operating a first semiconductor laser amplifier in a state of charge carrier saturation while a first input stream of optical pulses propagates through and is amplified and chirped by the first laser amplifier and then emerges from the laser amplifier and enters into and propagates through a first optical fiber segment which exhibits significant optical dispersion, whereby a significant pulse compression occurs during propagation of the pulses in an initial portion of the first fiber segment so that a significant enhancement of the span of the first fiber segment is enabled and whereby a first fiber output stream of recognizable optical pulses emanates from an output end of the first fiber segment.

7. The method of claim 6 in which the steam has a pulse repetition rate of at least about 8 GHz.

8. The method of claim 6 in which the first stream comprises an optical carrier having a wavelength of about 1.5 μm, in which the pulse repetition rate is at least 8 GHz, and in which the optical fiber segment is essentially silica.

9. The method of claim 6 comprising the further step of operating a second semiconductor laser, substantially identical to the first, in saturation while a second input stream of optical pulses derived from first fiber output stream passes through and is amplified and chirped by the second laser amplifier, and emerges from the second laser amplifier and enters into and propagates through a second optical fiber segment which exhibits significant optical dispersion, whereby the significant pulse compression occurs during propagation of the pulses through an initial portion of the second fiber segment.

10. The method of claim 9 in which the stream has a pulse has a pulse repetition rate of at least about 8 GHz.

11. The method of claim 10 in which the optical fiber segment is essentially silica.

12. The method of claim 9 which the first stream comprises an optical carrier having a wavelength of about 1.5 μm, in which the pulse repetition rate is at least 8 GHz, and in which the optical fiber segment is essentially silica.

* * * * *